(12) United States Patent
Deng et al.

(10) Patent No.: US 7,350,561 B2
(45) Date of Patent: Apr. 1, 2008

(54) HEAT SINK WITH COMBINED FINS

(75) Inventors: Gen-Ping Deng, Shenzhen (CN); Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 171 days.

(21) Appl. No.: 11/308,297

(22) Filed: Mar. 15, 2006

(65) Prior Publication Data

US 2007/0215320 A1    Sep. 20, 2007

(51) Int. Cl.
*F28F 3/08* (2006.01)

(52) U.S. Cl. ..................... 165/80.3; 165/185

(58) Field of Classification Search ............... 165/80.2, 165/80.3, 185; 361/703, 697; 29/890.039
See application file for complete search history.

(56) References Cited

U.S. PATENT DOCUMENTS

| | | | |
|---|---|---|---|
| 3,471,757 A * | 10/1969 | Sias | ........................... 257/726 |
| 5,761,811 A | 6/1998 | Ito | |
| 6,076,594 A * | 6/2000 | Kuo | ........................... 165/80.3 |
| 6,199,627 B1 | 3/2001 | Wang | |
| 6,401,810 B1 * | 6/2002 | Kuo et al. | ................... 165/185 |
| 6,571,859 B2 | 6/2003 | Graf et al. | |
| 6,655,448 B1 * | 12/2003 | Lin | ........................... 165/80.3 |
| 6,883,592 B2 * | 4/2005 | Lee | ........................... 165/80.3 |

* cited by examiner

*Primary Examiner*—Teresa J. Walberg
(74) *Attorney, Agent, or Firm*—Jeffrey T. Knapp

(57) ABSTRACT

A heat sink (10) for removing heat from heat-generating devices includes a plurality of fins (12) interconnected together by a fastener (20) extending therethrough. Each fin comprises a main body (14) and a flange (16) bent from an edge of the body. The main body has a thickness and defines a through hole (141, 142, 143) therein. The fastener comprises a plurality of alternating bars (200) and positioned portions (212). Each positioned portion has a same thickness as the main body and is accommodated in the through hole. Each bar is sandwiched between two adjacent main bodies, for fixing the fins in position and preventing the fin from sliding along a length direction of the fastener. The bar has a width larger than a diameter of the through hole.

16 Claims, 5 Drawing Sheets

HEAT SINK WITH COMBINED FINS

FIELD OF THE INVENTION

The present invention relates generally to a heat sink, and more particularly to a heat sink having combined fins for dissipating heat generated by an electrical package such as a Central Processing Unit (CPU), and the fins can be firmly combined together.

DESCRIPTION OF RELATED ART

During operation of a computer, heat is generated by electrical components thereof, and especially by electronic packages such as central processing units (CPUs). High-speed processing of signals by a CPU results in a correspondingly high amount of heat being generated. The heat must be efficiently removed, to prevent the CPU from becoming unstable or being damaged. A Heat sink is frequently used to dissipate the heat from the CPU.

Referring to FIG. 5, a typical heat sink 210 comprises a plurality of fins 202 and a metal base 212. Each fin 202 forms two flanges 204 at upper and lower sides thereof. Each flange 204 has a plurality of cutouts 206 and tabs 208 opposite to the cutouts 206. The fins 202 are interconnected together to form a fin combination by fitting the tabs 208 into corresponding cutouts 206. Then the fin combination is soldered to the base 212 to form the heat sink 210.

However, the combined fin combination as shown in FIG. 5 is relatively loose, since the fins 202 are combined together only through the tabs 208 fitting into the cutouts 206. In addition, each fin 202 needs extra material to form the flanges 204 with the tabs 208 and cutouts 206 to connect the fins 202 together, and the tabs 208 and cutouts 206 of the fins 202 are positioned at the lower and upper flanges 204 of the fins, wherein the lower flanges 204 are used to be soldered to the base 212. The tabs 208 and cutouts 206 at the lower flanges 204 cause the lower flanges 204 to have an uneven contact with the base 212. Such uneven contact lowers the heat-conductive efficiency between the base 212 and the fins 202. Furthermore, a process to form the fins 202 is excessively time consuming and costly because it requires a plurality of successive stamping stations in order to form the tabs 208 and cutouts 206 of the flanges 204.

Therefore, it is desired to design a novel heat sink to overcome the aforementioned problems.

SUMMARY OF INVENTION

A heat sink for removing heat from heat-generating devices in accordance with a preferred embodiment of the present invention comprises a plurality of fins interconnected together by a fastener 20 extending therethrough. Each fin comprises a main body and a flange bent from an edge of the body. The main body has a thickness and defines a through hole therein. The fastener comprises a plurality of alternating bars and positioned portions. Each positioned portion has a same thickness as the main body and is accommodated in the through hole. Each bar is sandwiched between two adjacent main bodies, for preventing the fin from sliding along a length direction of the fastener. Each bar has a width larger than a diameter of the through hole.

A method for assembling the heat sink in accordance with the preferred embodiment of the present invention, comprises steps of:

a). preparing a plurality of fins each comprising a main body with a flange extending perpendicularly from the main body, a through hole defined in the main body;

b). providing a fastener extending through the through holes of the fins, the fastener being divided by the spaced main bodies into a plurality of alternating first portions and second portions, wherein each first portion is accommodated in the through hole, and each second portion is sandwiched between two adjacent main bodies; and c). flattening the second portions sandwiched between the two adjacent main bodies to form bars, the bars fixing the fins in position and preventing the fins from sliding along a length direction of the fastener.

Other advantages and novel features of the present invention will become more apparent from the following detailed description of preferred embodiment when taken in conjunction with the accompanying drawings, in which:

DETAILED DESCRIPTION

Figure 1:
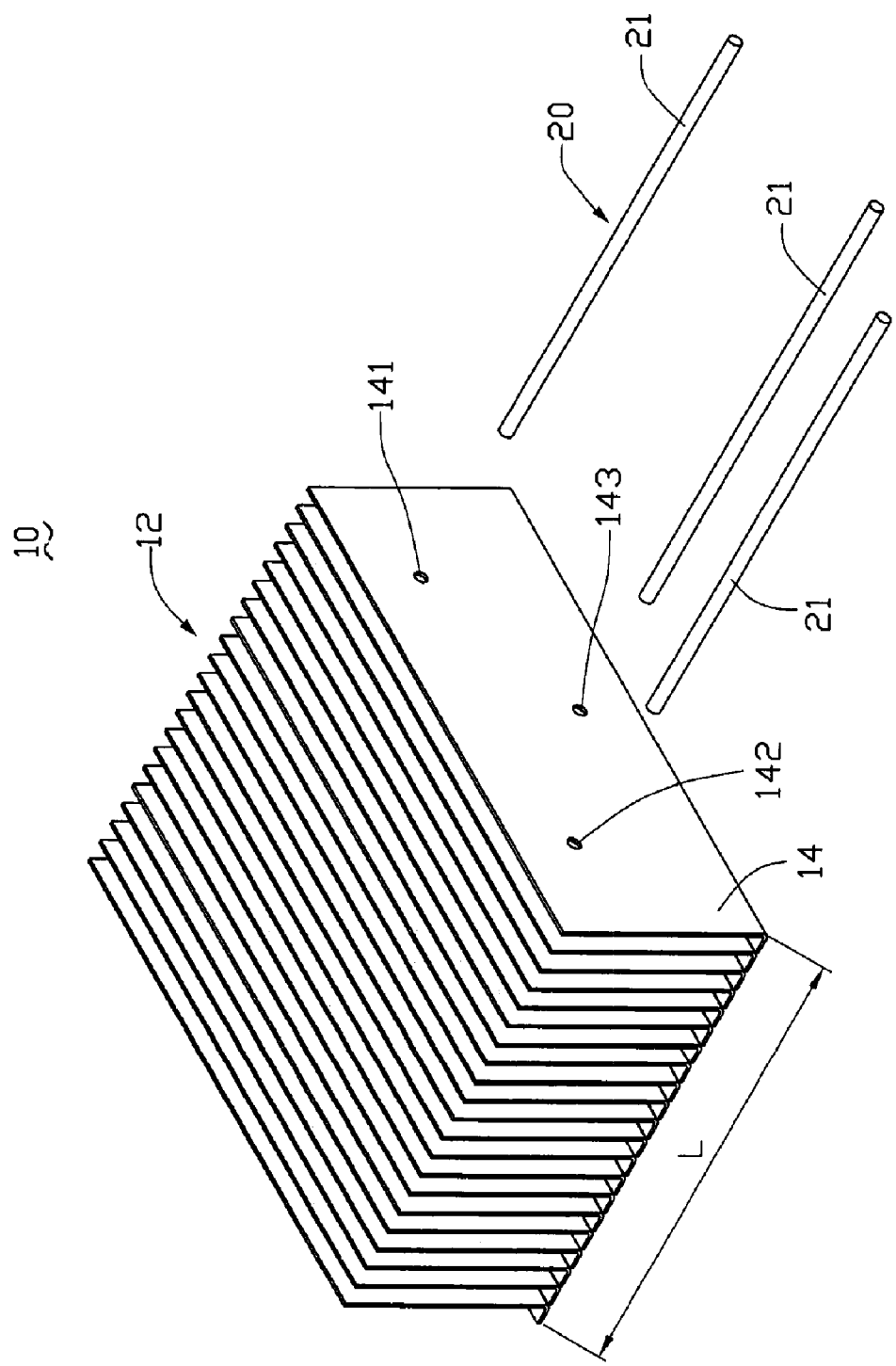
FIG. 1 is an exploded, isometric view of a heat sink assembly in accordance with a preferred embodiment of the present invention, wherein the heat sink assembly comprises a plurality of fins and a fastener.
Figure 2:
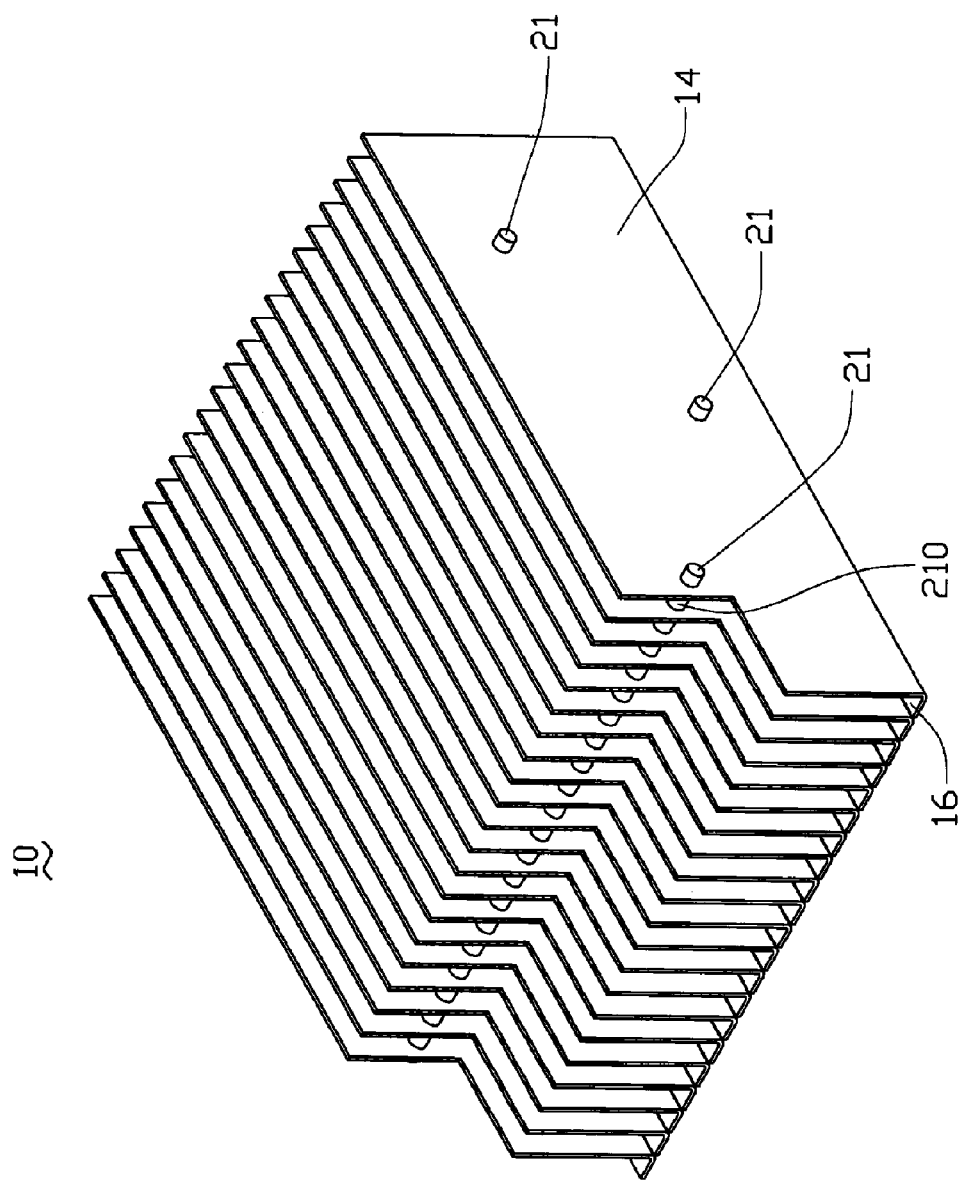
FIG. 2 is an isometric view of a semi-finished product of the heat sink assembly before a pressing action is applied to the fastener, wherein a part of the fins is cut away for clarity of viewing an inner structure of the semi-finished product.

Referring to FIG. 1 and FIG. 2, a heat sink assembly 10 in accordance with a preferred embodiment of the present invention comprises a plurality of fins 12. The fins 12 are interconnected together by a fastener 20 extending therethrough.

Each fin 12 comprises a flat main body 14 having a perpendicular bottom flange 16. An internal space of two neighboring fins 12 is substantially equal to a width of the bottom flange 16. Three round through holes 141, 142, 143 are defined in the main body 14 of each fin 12 for insertion of the fastener 20, wherein a perpendicular distance between the hole 141 and the bottom flange 16 is equal to that of between the hole 142 and the bottom flange 16. The holes 141, 142 are above the hole 143. Each hole 141, 142, 143 has a circular shape. A center of the hole 143 is in alignment with a central line of the main body 14 between two lateral sides thereof. The two holes 141, 143 are symmetrically arranged at two flanks of the central line. Thus, a triangle is formed by connecting lines of the three holes 141, 142, 143.

The fastener 20 comprises three elongated pins 21 corresponding to the through holes 141, 142, 143. Each pin 21 is cylindrical and has a length longer than a whole length L of the fins 12. Each pin 21 has a diameter the same as that of each through hole 141, 142, 143.

Figure 3:
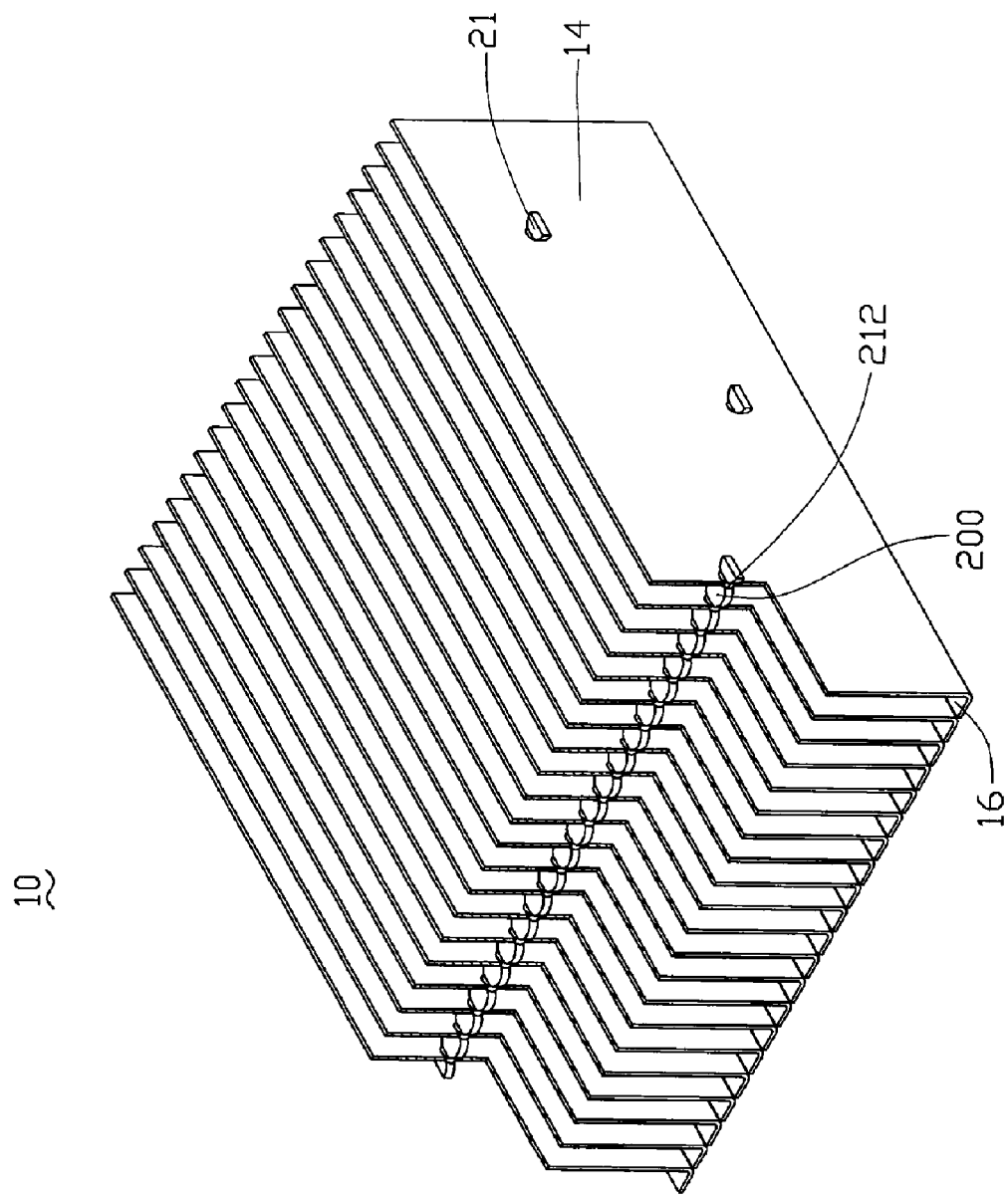
FIG. 3 is an assembled, isometric view of the heat sink assembly, wherein a part of the fins is cut away for clarity.
Figure 4:
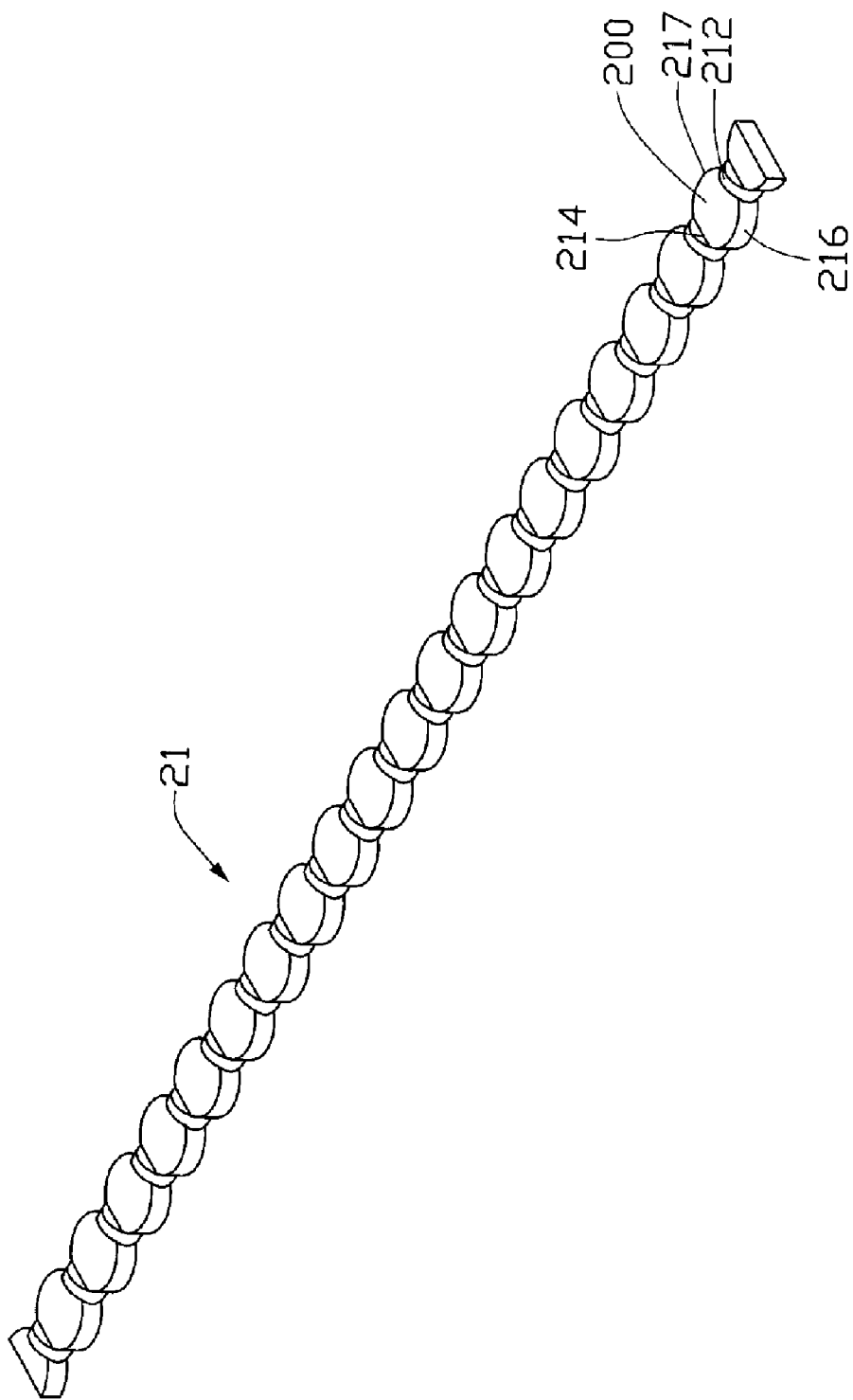
FIG. 4 is an isometric view of the fastener of FIG. 3.
Figure 5:
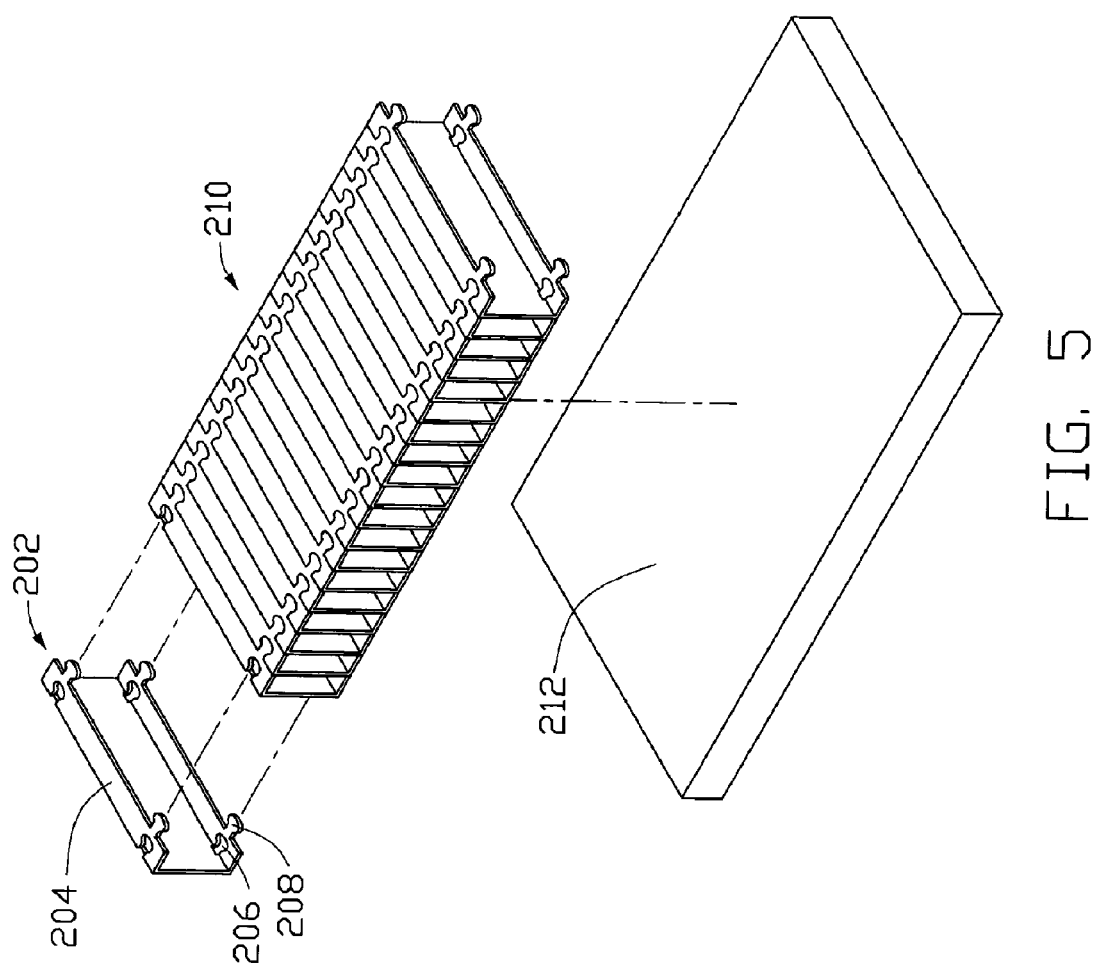
FIG. 5 is an exploded view in accordance with a conventional heat sink.

Also referring to FIG. 3, in assembly, the fins 12 are placed parallel to one another. Each through hole 141, 142, 143 of each fin 12 is in alignment with the through hole 141, 142, 143 of adjacent fins 12. The three pins 21 extend through the corresponding holes 141, 142, 143. Each pin 21 is divided by parallel spaced flat main bodies 14 of the fins 12 into a plurality of alternating separating portions 210 and positioned portions 212 (shown in FIG. 4), wherein each separating portion 210 is sandwiched by two adjacent spaced main bodies 14, and each positioned portion 212 is accommodated in the through hole 141, 142, 143. A thickness of the positioned portion 212 is equal to a thickness of each fin 12. After insertion of the fastener 20 in the through holes 141, 142, 143, a pressing machine (not shown) is applied on the fastener 20 to flatten the separating portions 210 of each pin 21 such that flattened bars 200 are formed by the separating portions 210. Each flattened bar 200 is located between two neighboring spaced main bodies 14. Each of the pins 21 is formed with a plurality of alternating flattened bars 200 and positioned portions 212. The flattened bars 200 of each pin 21 and the positioned portions 212 integrally interconnecting with the flattened bars 200 have a same central axis. Each flattened bar 200 has a rectangular cross-section with a width larger than a diameter of each of the through holes 141, 142, 143. The flattened bars 200 are used for fixing the fins 12 in position, whereby the fins 12 are prevented from sliding along the length direction of the pins 21. A flange 214 (shown in FIG. 4) is formed where the flattened bar 200 is connected with a corresponding positioned portion 212. The flattened bar 200 forms a pair of symmetrical arced edges 216, 217 (shown in FIG. 4) located beyond two sides of the positioned portion 212, respectively, for preventing each fin 12 from sliding along the length direction of the pins 21. Each fin 12 is sandwiched by three pairs of adjacent flattened bars 200. Thus, the fins 12 are securely connected together and have a sturdy structure, so that the risk of any of the fins 12 disengaging from each other is prevented. The combined fins 12 are easily and reliably put on a metal base (not shown). The bottom flanges 16 are soldered to the metal base.

A process for manufacturing the heat sink assembly 10 comprises following steps in sequence: preparing fins 12, bending the fins 12 to form the bottom flanges 16, aligning the fins 12 and punching three through holes 141, 142, 143 in the fins 12, providing the three pins 21 and extending the three pins 21 through the through holes 141, 142, 143, flattening the separating portions 210 sandwiched between the two adjacent fins 12 to obtain the flattened bars 200, and obtaining the heat sink assembly 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:
   a plurality of fins, each fin comprising a main body, the main body defining a through hole therein;
   an elongated fastener comprising a plurality of bars and positioned portions alternately arranged along a length direction of the fastener;
   wherein each of the positioned portions is accommodated in the through hole and integrally interconnected with the bar adjacent to the positioned portion, each of the bars is sandwiched by two adjacent main bodies for securing the fins in position and preventing the fins from sliding along the length direction of the fastener.

2. The heat sink assembly as described in claim 1, wherein a flange is bent from an edge of the main body.

3. The heat sink assembly as described in claim 1, wherein the bar is flattened.

4. The heat sink assembly as described in claim 1, wherein the bar has a rectangular cross-section.

5. The heat sink assembly as described in claim 4, wherein the through hole has a circular shape.

6. The heat sink assembly as described in claim 5, wherein the bar has a width larger than a diameter of the through hole.

7. The heat sink assembly as described in claim 1, wherein the flattened bars of the fastener and the positioned portions interconnecting with the flattened bars have a same central axis.

8. The heat sink assembly as described in claim 1, wherein the bar forms a pair of symmetrical arced edges located beyond two sides of the positioned portion, respectively.

9. The heat sink assembly as described in claim 1, wherein a flange is formed by the fastener, interconnecting the flattened bar and the positioned portion.

10. A method for assembling a heat sink, comprising steps of:
   a). preparing a plurality of fins each comprising a main body with a flange extending perpendicularly from the main body, a through hole defined in the main body;
   b). providing an elongated fastener extending through the through holes of the fins, the fastener being divided by the spaced main bodies into a plurality of alternating first portions and second portions, wherein each of the first portion is accommodated in the through hole, and each of the second portion is sandwiched by two adjacent main bodies; and
   c). flattening the second portions sandwiched by the two adjacent main bodies to form bars for fixing the fins in position and preventing the fins from sliding along a length direction of the fastener.

11. The method for assembling a heat sink as described in claim 10, wherein the bar has a rectangular cross-section.

12. The method for assembling a heat sink as described in claim 11, wherein the through hole has a circular shape.

13. The method for assembling a heat sink as described in claim 12, wherein the rectangular cross-section has a width larger than a diameter of the through hole.

14. The method for assembling a heat sink as described in claim 10, wherein the flattened bars and the first portions interconnecting with the flattened bars have a same central axis.

15. The method for assembling a heat sink as described in claim 10, wherein the bar forms a pair of symmetrical arced edges located beyond two sides of the first portion, respectively.

16. A fin combination for a heat sink for dissipating heat from an electronic component, comprising:
   a first fin;
   a second fin; and
   a pin extending through the first fin and second fin, wherein the pin has a first portion received in the first and second fins and a second portion outside the first and second fins, the second portion being flattened to have a width larger than a diameter of the first portion whereby the first and second fins are secured in position by the second portion.

* * * * *